US006445249B1

(12) United States Patent
Khan et al.

(10) Patent No.: US 6,445,249 B1
(45) Date of Patent: Sep. 3, 2002

(54) MODIFICATION OF PHASE COMPONENT OF ERROR SIGNAL TO REDUCE VARIATION OF PHASE COMPONENT OF OUTPUT SIGNAL OF POWER AMPLIFIER

(75) Inventors: Andrew Merritt Khan, Schaumburg; George Francis Opas, Park Ridge, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/925,556

(22) Filed: Aug. 8, 2001

(51) Int. Cl.[7] ................................................ H03F 1/26
(52) U.S. Cl. ........................ 330/149; 330/107; 330/136
(58) Field of Search ................................. 330/107, 136, 330/149; 332/455; 375/297

(56) References Cited

U.S. PATENT DOCUMENTS 5,111,155 A    5/1992  Keate et al.
5,142,240 A    8/1992  Isota et al.
5,420,536 A    5/1995  Faulkner et al.
5,886,572 A  * 3/1999  Myers et al. .................. 330/10
5,936,464 A  * 8/1999  Grondahl ...................... 330/10
6,175,273 B1 * 1/2001  Sigmon et al. ............... 330/10
6,388,518 B1 * 5/2002  Miyatani ..................... 330/149

* cited by examiner

*Primary Examiner*—Robert Pascal
*Assistant Examiner*—Henry Choe
(74) *Attorney, Agent, or Firm*—Kenneth A. Haas

(57) ABSTRACT

System (100) is coupled with power amplifier (106). Generation component (166) generates error signal (110) based at least in part on an input signal (144) for the system (100). The error signal (110) includes a phase component. The input signal (144) includes an envelope component. Modification component (130) modifies the phase component of the error signal (110) in response to the envelope component of the input signal to reduce variation of a phase component of the power amplifier output signal (194).

22 Claims, 13 Drawing Sheets

US 6,445,249 B1

MODIFICATION OF PHASE COMPONENT OF ERROR SIGNAL TO REDUCE VARIATION OF PHASE COMPONENT OF OUTPUT SIGNAL OF POWER AMPLIFIER

TECHNICAL FIELD

This invention relates generally to telecommunications and more particularly a linear transmitter that combines feedback linearization with envelope modulated signal formats.

BACKGROUND OF THE INVENTION

The world-wide use of transmitters employing linear modulation with a non-constant envelope has created a need for improved power efficiency in transmitters. Because of this need, supply modulation is applied to the final stages of transmitters.

In existing linear transmitters employing feedback linearization in combination with supply modulation, the incidental phase modulation occurring in the final stages of the transmitter induced by the supply modulation can reduce the normally adequate phase margin level in the system dramatically. Also, in existing systems, supply modulation is combined with various linearization topologies. The envelope component may selectively be mapped to provide optimum power efficiency versus drive level and to have a reduced bandwidth prior to its application as supply modulation.

Disadvantageously, applying supply modulation in the final stages of a feedback-linearized transmitter system creates an incidental phase modulation that can create highly-peaked closed-loop frequency responses that put excessive noise into neighboring channels. Also, applying supply modulation in the final stages of feedback-linearized transmitters can create outright instability.

BRIEF DESCRIPTION OF THE DRAWINGS

The advantages of the present invention will be explained in greater detail and others will be made apparent from the detailed description of one exemplary embodiment which references the following drawings, in which.

DETAILED DESCRIPTION

One embodiment of the present invention adds circuitry to map the envelope component of the input signal applied to a transmitter system employing feedback linearization. The mapped envelope component is then applied to a phase modulator. The combined response of the mapping function and the transfer characteristic of the phase modulator selectively compensates or cancels the incidental phase modulation occurring in the final stages of the transmitter brought about by the envelope-related supply modulation. Thus, response peaking or instability under high-dynamic-range envelope modulation scenarios from incidental phase modulation is precluded. Advantageously, the transmitter system employing feedback linearization is ensured stability.

Figure 1:
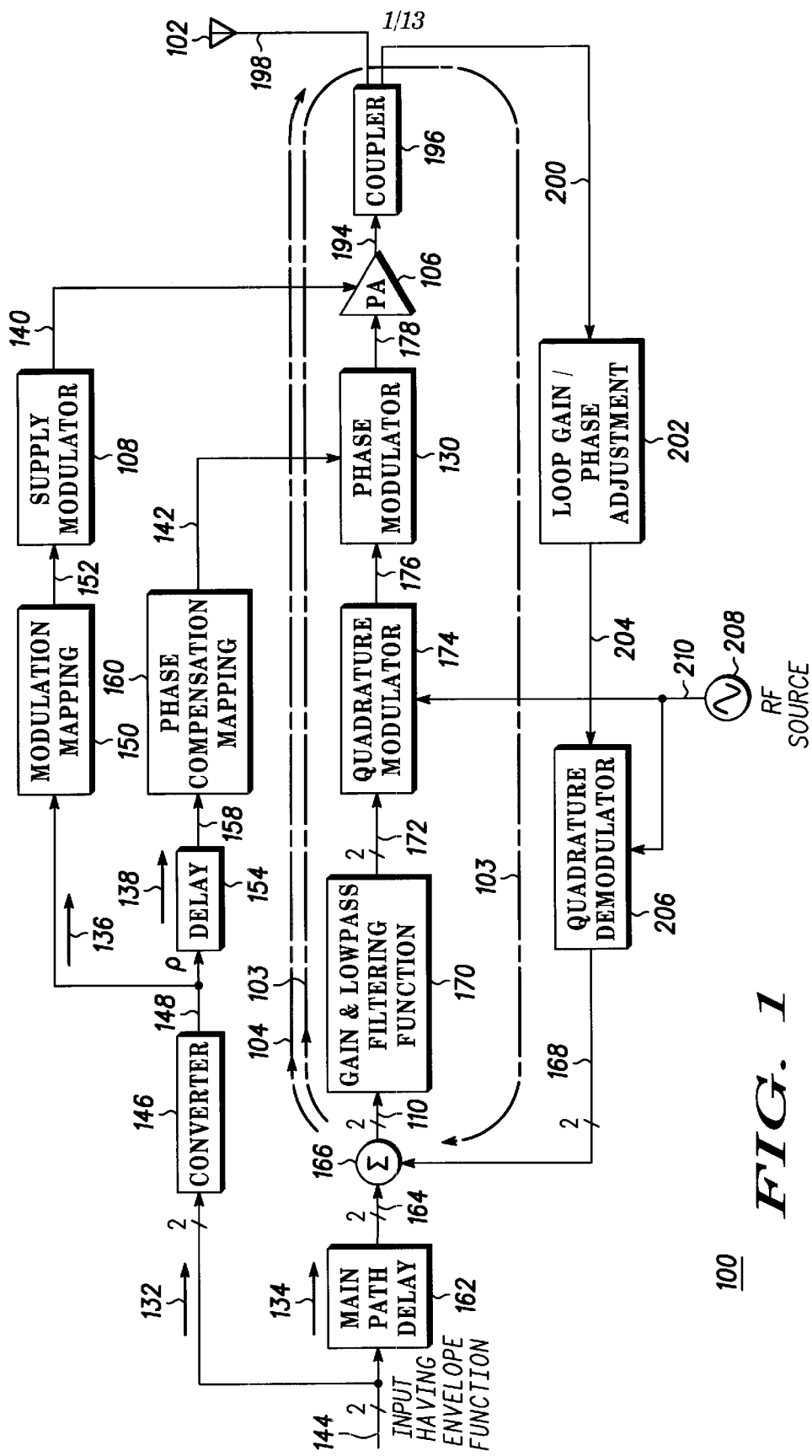
FIG. 1 is a block diagram of a system with a Cartesian feedback loop, a phase modulator, a phase compensation mapping, a modulation mapping, a supply modulator and a power amplifier.

Referring now to FIG. 1, a system 100 in one example is shown having an antenna 102 for transmitting and receiving signals. The system 100 is selectively a control system. The system 100 employs a control loop 103. The control loop 103 selectively employs a feedback linearization. While Cartesian feedback is depicted in FIG. 1, the feedback linearization selectively employs Cartesian feedback, Radio Frequency ("RF") feedback, Intermediate Frequency ("IF") feedback or Polar feedback. The control loop 103 has a forward path 104. The system 100 is coupled with a power amplifier 106. The power amplifier 106 receives a supply modulation from a supply modulator 108. The supply modulation provides a power efficiency enhancement in the power amplifier 106. The supply modulation also creates a phase variation between a power amplifier output signal 194 of the power amplifier 106 and an error signal 110 of the system 100. The phase variation causes the system 100 to experience instability.

Figure 2:
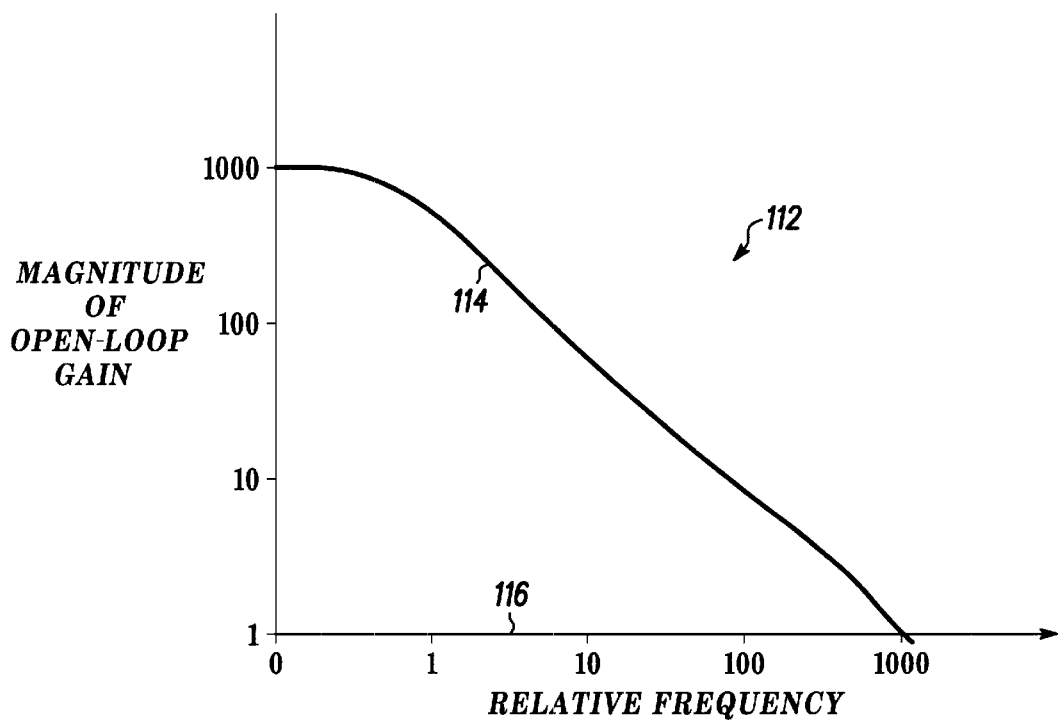
FIG. 2 is a graph of an open-loop gain magnitude when a system is stable.
Figure 3:
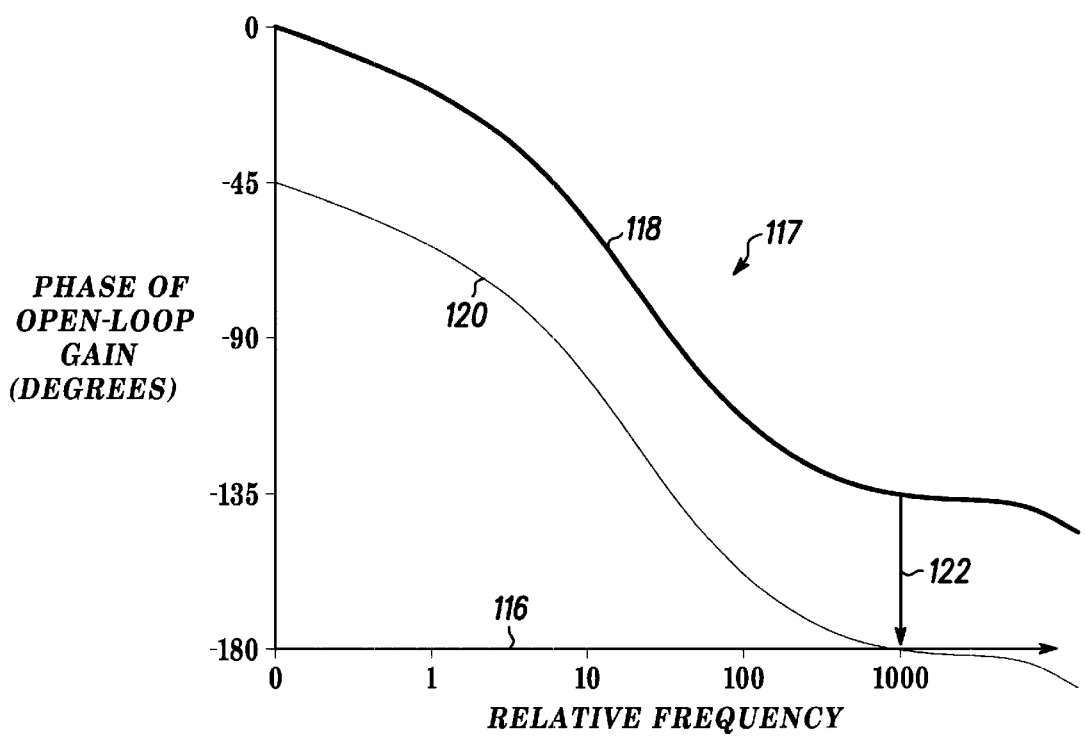
FIG. 3 is a graph of an open-loop gain phase depicting the open-loop gain phase when the system is under nominal conditions and when the system is under supply modulation.

A control system has an open-loop gain. Referring now to FIG. 2, an open-loop gain magnitude graph 112 depicts a magnitude 114 of an open-loop gain of a control system versus a relative frequency 116. The open-loop gain magnitude graph 112 depicts a traditional "bode plot" for showing the stability of a control system. As the example in FIG. 2 shows, the open-loop gain has a maximum value of 1000 when the relative frequency 116 is low, and the open-loop gain drops to a value of 707 (−3 dB) when the relative frequency 116 is unity and the magnitude 114 of the open-loop gain selectively approaches unity at a relative frequency of 1000. To ensure stability of the control system a phase of the open-loop gain must be at least 45° away from 180° at the relative frequency of 1000 or a phase margin must be at least 45° at the relative frequency of 1000. Referring now to FIG. 3, an open-loop gain phase graph 117 depicts a phase of an open-loop gain of a control system versus the relative frequency 116. When the control system experiences nominal conditions, the open-loop gain has a phase margin 118 of 45° to ensure stability as the open-loop gain selectively approaches unity at the relative frequency 116 of 1000. However, when the final stages within a transmitter that has a control system for linearization are supply-modulated, the open-loop gain experiences a reduced phase margin 120 from −180°. In the prior art, when the reduced phase margin 120 approaches O at the relative frequency 116 of 1000 as a result of the final stages of the transmitter introducing a phase shift 122 of 45°, a control system will disadvantageously experience instability.

Figure 4:
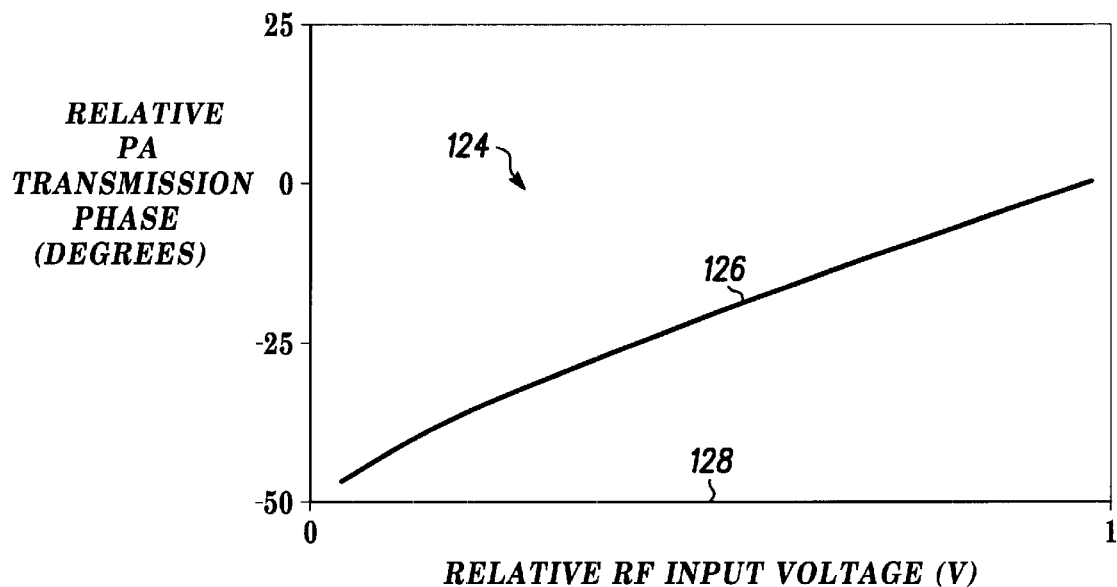
FIG. 4 is a graph of a power amplifier transmission phase when the power amplifier is under supply modulation.

Referring now to FIG. 4, a power amplifier transmission phase graph 124 depicts a phase shift of a power amplifier under supply modulation 126 for a relative radio frequency input voltage 128. As the relative radio frequency input voltage 128 decreases from a maximum voltage of approximately 1 volt down to approximately zero volts, the power amplifier causes a phase margin of a control system to become less than 45°, which creates potential instability. As an example, if a relative transmission phase of the power amplifier under supply modulation changes from 0° to −45°, the reduced phase margin 120 of the open-loop gain phase graph 117 of FIG. 3 is created as a result of the phase shift of the power amplifier under supply modulation 126.

Referring again to FIG. 1, the system 100 has a modification component, for example, a phase modulator 130 to overcome the instability of a control system in the prior art. The phase modulator 130 will be explained in greater detail below. The system 100 has a modulation/compensation path 132 and a main path 134. The modulation/compensation path 132 has a supply modulation branch 136 and a phase compensation branch 138. The supply modulation branch 136 generates a supply modulator output signal 140 for the power amplifier 106. The supply modulation branch 136 improves the operating efficiency of the power amplifier 106. The phase compensation branch 138 of the modulation/compensation path 132 of the system 100 generates a phase compensation mapping output signal 142.

During the operation of the present invention, an input signal 144 is transmitted to the system 100. The input signal 144 may selectively be an output signal from devices such as a modulator or a digital signal processor (DSP). The input signal 144 may selectively be a Cartesian baseband input signal. The input signal 144 may selectively be a Polar baseband input signal. The input signal 144 is at an inadequate power level to drive the antenna 102. The input signal 144 also has a relative bandwidth. The input signal 144 has an envelope component. The envelope component of the input signal 144 may selectively traverse a dynamic range. The input signal 144 is fed to the modulation/compensation path 132 of the system 100 and to the main path 134 of the system 100.

In the modulation/compensation path 132 of the system 100, a converter 146 receives the input signal 144. The converter 146 may selectively be a Cartesian-to-Envelope Converter that extracts an envelope information from a polar representation of the input signal 144. The converter 146 may also selectively be a mathematical converter that converts the input signal 144 into a polar form that has an envelope component and a phase component. The converter 146 generates a converter output signal 148. The converter output signal 148 may selectively be the envelope information of the polar representation. The converter output signal 148 may selectively be the envelope component and the phase component. The converter 146 transmits the envelope component of the converter output signal 148 to a modulation mapping 150 of the supply modulation branch 136 of the modulation/compensation path 132 of the system 100. The converter 146 transmits the envelope component of the converter output signal 148 to a delay 154.

The modulation mapping 150 receives the envelope component of the converter output signal 148. The modulation mapping 150 may selectively process the envelope component of the converter output signal 148 through a mapping function to reduce the bandwidth of the envelope component. The modulation mapping 150 may selectively be a linear mapping which may provide a signal that is related to the converter output signal 148 by a fixed constant. The modulation mapping 150 produces a modulation mapping output signal 152 that varies relative to the envelope component of the converter output signal 148. The modulation mapping output signal 152 is selectively a mapped envelope component. The modulation mapping 150 transmits the modulation mapping output signal 152 to the supply modulator 108.

The supply modulator 108 receives the modulation mapping output signal 152. The supply modulator 108 may selectively have a switching modulator that performs switching power supply techniques. The supply modulator 108 may selectively have a non-switching modulator. The supply modulator 108 applies amplification to the modulation mapping output signal 152 over a baseband frequency range that is selectively chosen. The supply modulator 108 amplifies the modulation mapping output signal 152 to produce the supply modulator output signal 140. The supply modulator output signal 140 is selectively a voltage supply that is at an adequate voltage level to supply the power amplifier 106. The supply modulator 108 amplifies the modulation mapping output signal 152 in respect to a size of the converter output signal 148. If the converter output signal 148 has a large envelope component, then the supply modulator output signal 140 is large. If the converter output signal 148 has a low envelope component, then the supply modulator output signal 140 is low.

The supply modulator 108 transmits the supply modulator output signal 140 to the power amplifier 106 to promote an increase in operating power efficiency of the power amplifier 106 by transmitting the supply modulator output signal 140 that varies relative to the envelope component of the converter output signal 148 to the power amplifier 106. The supply modulator output signal 140 generates a modification in a phase component of the power amplifier output signal 194 of the power amplifier 106.

Figure 5:
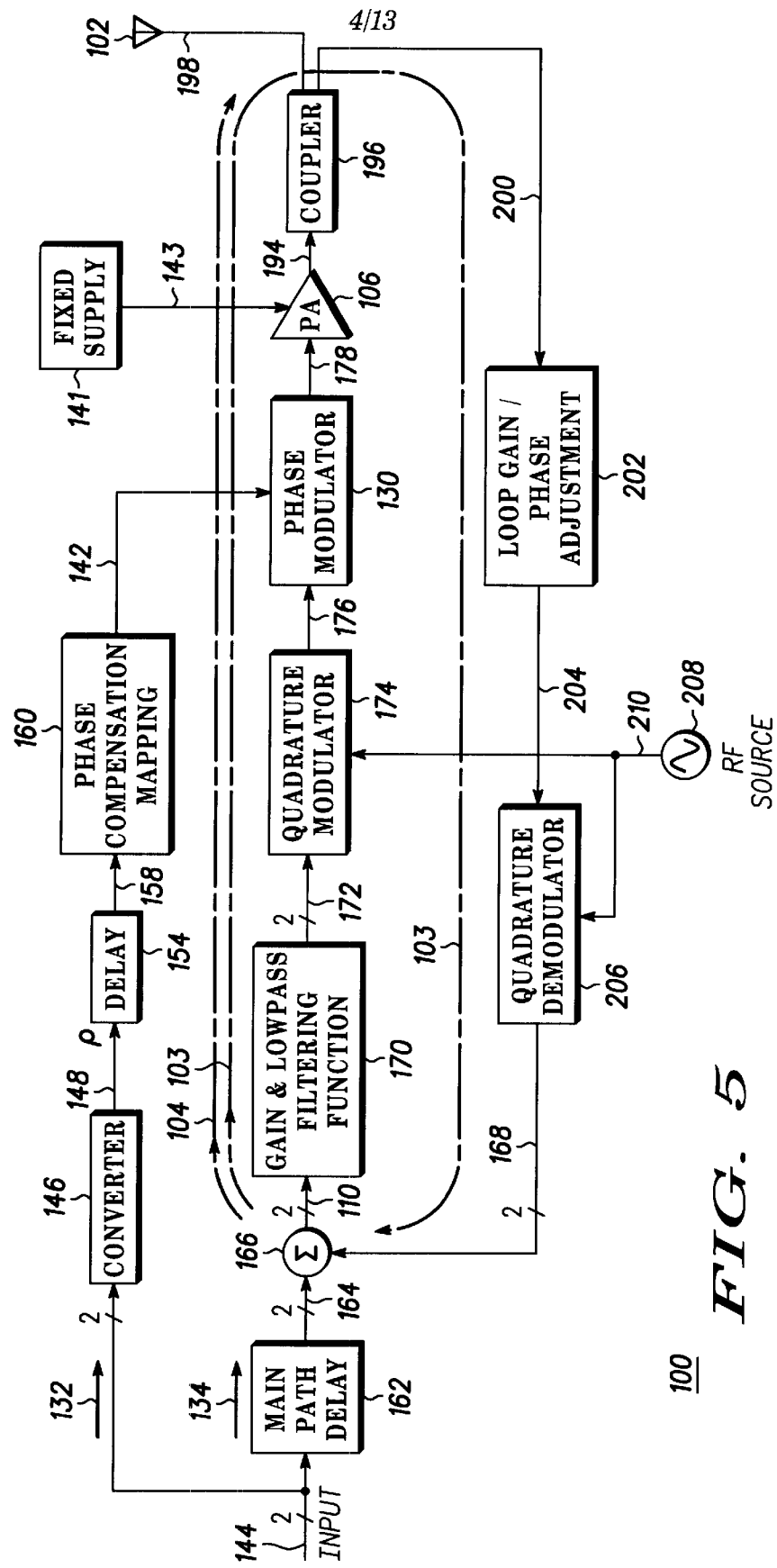
FIG. 5 is a block diagram of an alternate embodiment of a system with a Cartesian feedback loop but without a modulation mapping and without a supply modulator.

Referring now to FIG. 5, the system 100 may have an alternate embodiment. In the alternate embodiment, the supply modulation branch 136, the modulation mapping 150, and the supply modulator 108 may selectively be omitted. In the alternate embodiment, the system 100 has a fixed supply 141 that is a voltage source. The fixed supply 141 transmits a supply voltage 143 to the power amplifier 106 within the forward path 104 of the control loop 103 of the system 100. The supply voltage 143 is at an adequate level to supply the power amplifier 106. The power amplifier 106 receives the supply voltage 143.

Referring again to FIG. 1, the phase compensation branch 138 of the modulation/compensation path 132 of the system 100 includes the delay 154. The delay 154 is a static element. The delay 154 receives the converter output signal 148. The delay 154 provides time alignment between the phase compensation mapping output signal 142 and the supply modulator output signal 140. The delay 154 produces a delayed output signal 158. The delay 154 transmits the delayed output signal 158 to a phase compensation mapping 160.

The phase compensation mapping 160 maps the delayed output signal 158 according to presupposed knowledge that the power amplifier 106 will impose a variation on the phase component of the power amplifier output signal 194 upon receiving the supply modulator output signal 140. The phase compensation mapping 160 has a mapping characteristic that is designed to selectively provide an approximately flat phase versus envelope characteristic in the forward path 104 of the control loop 103 of the system 100. The mapping characteristic may selectively be a phase versus envelope characteristic that is within an acceptable tolerance to perform the desired function of the phase compensation mapping 160. The phase versus envelope characteristic is also determined according to a non-linear response of the phase modulator 130.

The phase compensation mapping 160 generates the phase compensation mapping output signal 142. The phase compensation mapping 160 transmits the phase compensation mapping output signal 142 to the phase modulator 130 within the forward path 104 of the control loop 103 of the main path 134 of the system 100. The phase compensation mapping 160 drives the phase modulator 130 within the forward path 104 of the control loop 103 of the main path 134 of the system 100.

In the main path 134 of the system 100 a main path delay 162 receives the input signal 144. The main path delay 162 generates a main path delay output signal 164 and provides proper time alignment between a quadrature modulator output signal 176 and the already time-aligned combination of the supply modulator output signal 140 and the phase compensation mapping output signal 142. The main path delay 162 transmits the main path delay output signal 164 to a generation component, for example, summing junction 166 of the control loop 103 of the main path 134 of the system 100.

The summing junction 166 receives the main path delay output signal 164. The summing junction 166 also receives a quadrature demodulator output signal 168. The summing junction 166 compares the quadrature demodulator output signal 168 with the main path delay output signal 164 to generate the error signal 110, and thereby closing the control loop 103. The error signal 110 may selectively be a Cartesian error signal. The error signal 110 has a phase component. The summing junction 166 transmits the error signal 110 to a gain and low-pass filtering function 170 within the control loop 103 of the system 100.

The gain and low-pass filtering function 170 achieves proper feedback loop parameters. The gain and low-pass filtering function 170 generates a gain and low-pass filtering function output signal 172. The gain and low-pass filtering function 170 maintains the phase component of the error signal 110. The gain and low-pass filtering function 170 transmits the gain and low-pass filtering function output signal 172 to a quadrature modulator 174 of the control loop 103 of the system 100.

The system 100 also has a RF source 208. The RF source 208 is at a carrier frequency $F_c$ that corresponds to the operating frequency of the system 100. The RF source 208 generates a RF source output 210.

The quadrature modulator 174 receives the gain and low-pass filtering function output signal 172 and the RF source output 210. The quadrature modulator 174 translates the gain and low-pass filtering function output signal 172 up to a carrier frequency at which the system 100 operates. The carrier frequency emanates from the antenna 102. The quadrature modulator 174 generates a quadrature modulator output signal 176 that has an instantaneous phase component. The quadrature modulator 174 transmits the quadrature modulator output signal 176 to the phase modulator 130 within the forward path 104 of the control loop 103 of the system 100.

The phase modulator 130 receives the quadrature modulator output signal 176 and the phase compensation mapping output signal 142. The phase compensation mapping output signal 142 drives the phase modulator 130 in a manner to compensate for a predicted phase modification in the phase component of the power amplifier output signal 194 of the power amplifier 106 when the power amplifier 106 receives the supply modulator output signal 140. The phase modulator 130 modifies the instantaneous phase component of the quadrature modulator output signal 176 in response to the envelope component of the input signal 144 to reduce variation of the phase component of the power amplifier output signal 194. The phase modulator 130 modifies the instantaneous phase component of the quadrature modulator output signal 176 to approximately compensate for the predicted phase modification when the power amplifier 106 receives the supply modulator output signal 140. The phase modulator 130 modifies the instantaneous phase component of the quadrature modulator output signal 176 by adding a phase shift to the quadrature modulator output signal 176 that is approximately equal to in magnitude and opposite in direction relative to a direction of the phase modification in the phase component of the power amplifier output signal 194. The phase modulator 130 generates a phase modulator output signal 178 that has a modified phase component. The phase modulator 130 transmits the phase modulator output signal 178 with the modified phase component to the power amplifier 106 within the forward path 104 of the control loop 103 of the system 100.

The power amplifier 106 receives the phase modulator output signal 178 with the modified phase component and the supply modulator output signal 140. The power amplifier 106 has the phase component in the power amplifier output signal 194. The phase modulator output signal 178 drives the power amplifier 106. The supply modulator output signal 140 improves the power efficiency of the power amplifier 106. The power amplifier 106 amplifies the phase modulator output signal 178. The supply modulator output signal 140 creates the predicted phase modification in the phase component of the power amplifier output signal 194 that would create instability in the system 100 if the power amplifier 106 did not also receive the phase modulator output signal 178. The phase modulator output signal 178 compensates the predicted phase modification that the supply modulator output signal 140 created in the phase component of the power amplifier output signal 194. The phase modulator output signal 178 compensates the predicted phase modification by selectively reducing and/or approximately eliminating the predicted phase modification. The phase compensation thereby precludes the system 100 from experiencing instability by approximately maintaining a nominal predetermined phase margin within control loop 103.

Referring again to FIG. 5, it will be appreciated that the system 100 could become unstable without supply modulation being performed in the system. The power amplifier 106 may experience an unacceptable phase performance without undergoing supply modulation. The power amplifier 106 may experience unacceptable phase performance in response to a signal that drives the power amplifier 106. If the signal that drives the power amplifier 106 drives the power amplifier 106 from a low signal level to a high signal level, the power amplifier 106 will experience a drive level-related phase shift in the power amplifier output signal 194. The drive level-related phase shift could create instability in the system 100. The phase modulator 130 can also compensate the drive level-related phase shift.

Figure 6:
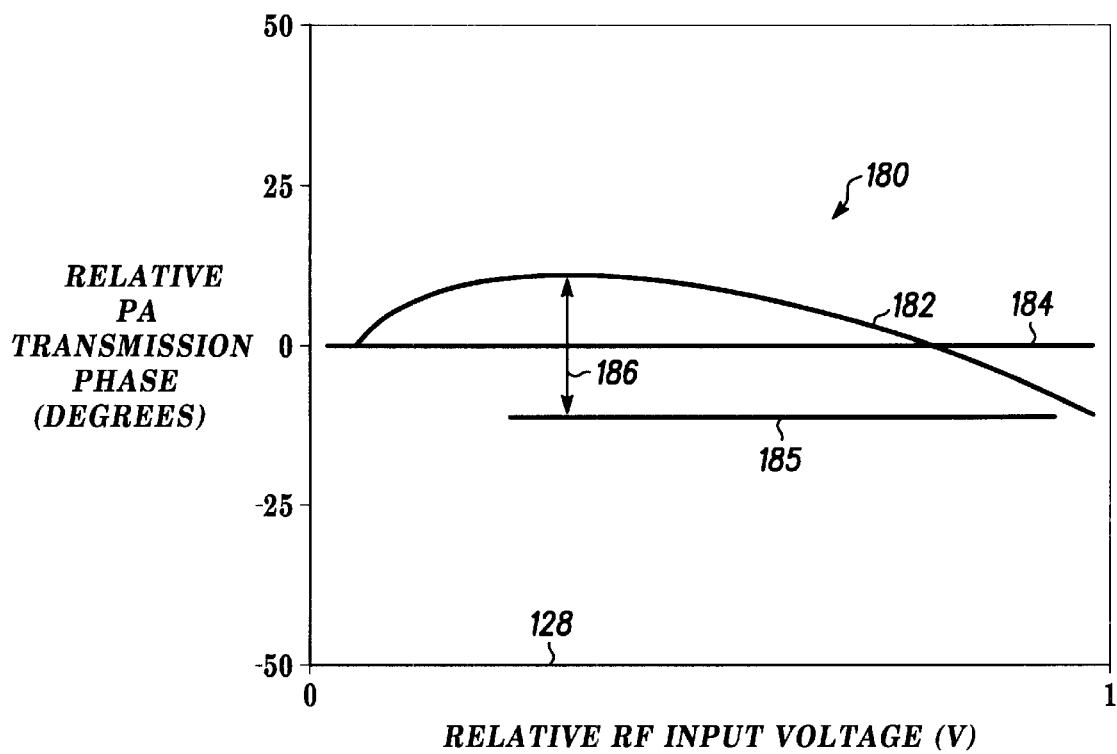
FIG. 6 is a graph of a compensated power amplifier transmission phase when the power amplifier is under supply modulation.

Referring now to FIG. 6, a compensated power amplifier transmission phase graph 180 depicts a compensated relative transmission phase 182 of the power amplifier 106 under supply modulation in comparison to a transmission phase 184 of an idealized power amplifier that would show no phase modification with supply modulation or drive variation. The compensated relative transmission phase 182 has a variation that is approximately centered about the transmission phase 184 of the idealized power amplifier. The transmission phase 184 of the idealized power amplifier is flat at 0° over a dynamic range of the relative radio frequency input voltage 128. The compensated relative transmission phase 182 results from the combination of the variable transmission phase component of the power amplifier 106 and the phase modulator output signal 178. A phase excursion 186 represents the total deviation of compensated relative transmission phase 182 from the transmission phase 184 of an idealized power amplifier. The phase excursion 186 is selectively approximately between +12° or −12° for a reasonable compromise between the required accuracy of the phase compensation mapping 160 and the stability of the system 100. A negative compensated transmission phase 185 results when the combination of the variable transmission phase component of the power amplifier 106 and the phase modulator output signal 178 is negative.

Figure 7:
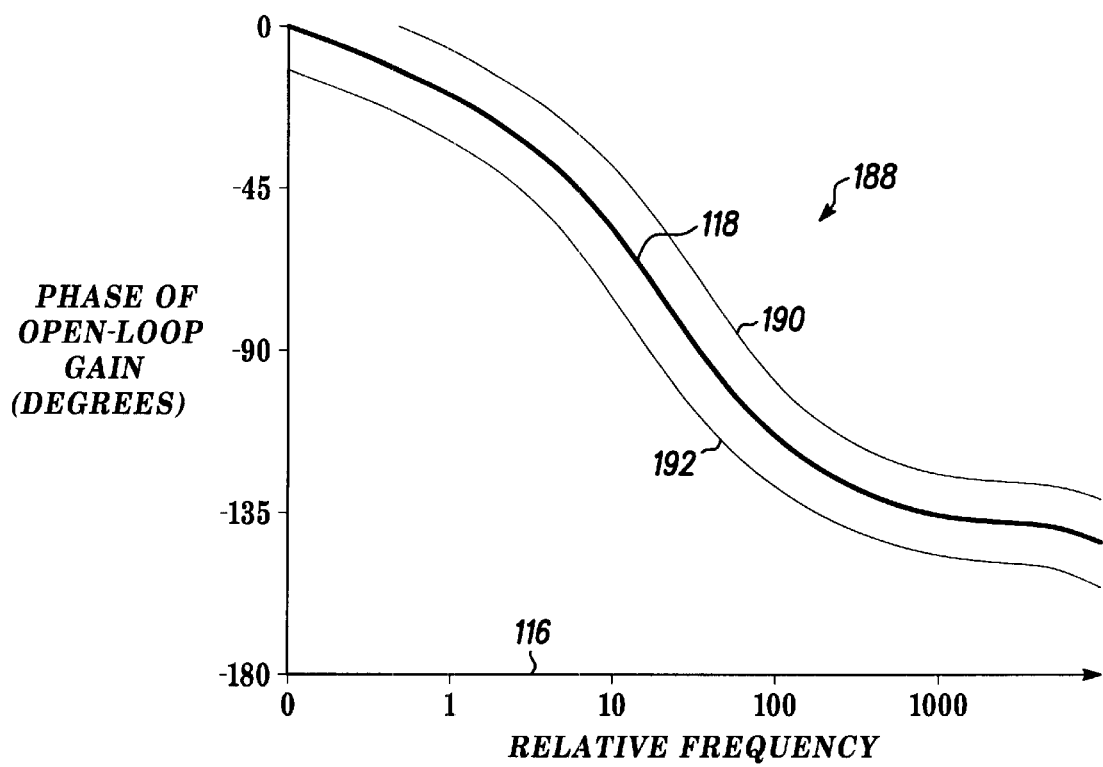
FIG. 7 is a graph of the compensated open-loop gain phase when a power amplifier is receiving a phase-compensated signal under supply modulation.

Referring now to FIG. 7, a compensated open-loop gain phase graph 188 depicts a phase of the open-loop gain for the relative frequency 116 within the system 100 when the power amplifier 106 is receiving the compensated transmission phase 182 under supply modulation. A positive phase shift 190 is created in response to the phase excursion 186 selectively being approximately +12°. The positive phase shift 190 is selectively a result of the variation of the compensated transmission phase 182 of FIG. 6 being approximately centered about the ideal transmission phase 184 of FIG. 6. A negative phase shift 192 is created in response to the phase excursion 186 selectively being approximately −12°. The negative phase shift 192 is selectively a result of the variation of the compensated transmission phase 182 of FIG. 6 being approximately centered about the ideal transmission phase 184 of FIG. 6. If the open-loop gain phase of the control loop 103 falls equal to or between the positive phase shift 190 and the negative phase shift 192, then the system 100 achieves stability by approximately maintaining a predetermined phase margin of 45° from −180° within the control loop 103.

Referring again to FIG. 1, the power amplifier 106 generates the power amplifier output signal 194. The power amplifier output signal 194 retains the modified phase component arising from the predicted phase modification that is a result of the variation of the supply modulator output signal 140 and the phase compensation that the phase modulator 130 provides. The power amplifier 106 transmits the power amplifier output signal 194 to a coupler 196 of the forward path 104 of the control loop 103 of the system 100. The coupler 196 receives the power amplifier output signal 194. The coupler 196 samples the power amplifier output signal 194. The coupler 196 transmits a major part 198 of the power amplifier output signal 194 to the antenna 102. The major part 198 of the power amplifier output signal 194 drives the antenna 102. The coupler 196 transmits a portion 200 of the power amplifier output signal 194 to be fed back through the control loop 103 of the system 100. The coupler transmits the portion 200 of the power amplifier output signal 194 to a loop gain/phase adjustment 202 of the control loop 103 of the system 100.

The loop gain/phase adjustment 202 receives the portion 200 of the power amplifier output signal 194. The loop gain/phase adjustment 202 provides a long term gain and phase adjustment to the portion 200 of the power amplifier output signal 194. The loop gain/phase adjustment 202 provides an appropriate gain level and an appropriate phase margin level for the control loop 103 of the main path 134 of the system 100. The long term gain and phase adjustment may selectively be in a steady-state mode. The loop gain/phase adjustment 202 provides proper stability to the feedback control loop 103 of the main path 134 of the system 100. The loop gain/phase adjustment 202 aligns the portion 200 of the power amplifier output signal 194. The loop gain/phase adjustment 202 generates a loop gain/phase adjustment output signal 204 and transmits the loop gain/phase adjustment output signal 204 to a quadrature demodulator 206 of the control loop 103 of the system 100.

The quadrature demodulator 206 receives the loop gain/phase adjustment output signal 204 and the RF source output 210. The quadrature demodulator 206 takes the carrier frequency information of the loop gain/phase adjustment output signal 204 and translates the loop gain/phase adjustment output signal 204 down to Cartesian baseband I and Q signals which constitute the quadrature demodulator output signal 168. The quadrature demodulator output signal 168 is selectively a feedback signal that is based on the portion 200 of the power amplifier output signal 194. The quadrature demodulator 206 transmits the quadrature demodulator output signal 168 to the summing junction 166 of the control loop 103 of the system 100.

Figure 8:
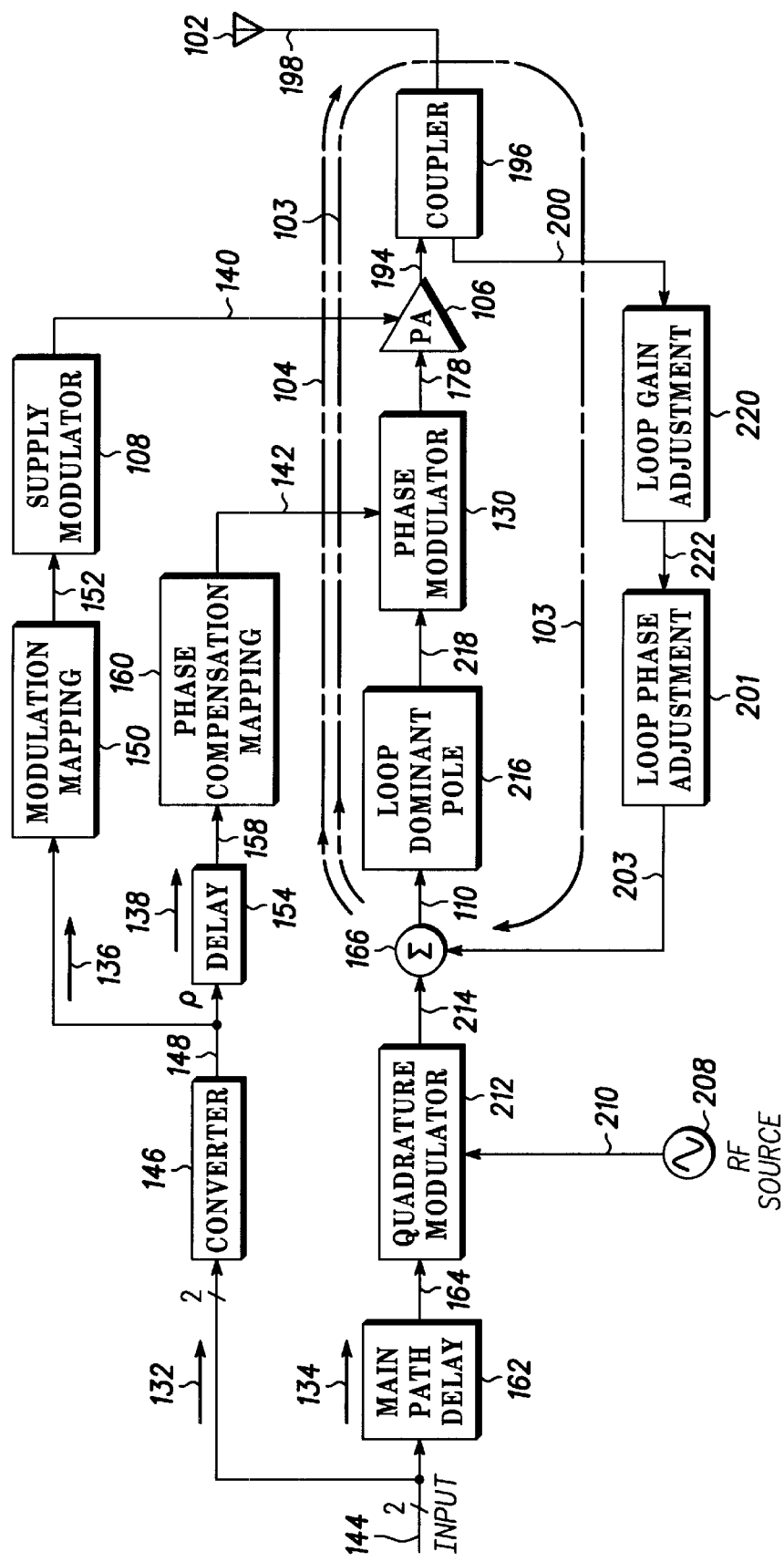
FIG. 8 is a block diagram of a system with a radio frequency feedback loop, a phase modulator, a phase compensation mapping, a modulation mapping, a supply modulator and a power amplifier.

Referring now to FIG. 8, an alternate embodiment for the system 100 is shown implementing radio frequency (RF) feedback. The main path delay 162 receives the input signal 144. The main path delay 162 generates the main path delay output signal 164.

The system 100 has a RF quadrature modulator 212 that receives the main delay output signal 164 and the RF source output 210. The RF quadrature modulator 212 translates the main path delay output signal 164 up to the carrier frequency $F_c$. The RF quadrature modulator 212 generates a RF quadrature modulator output signal 214.

The summing junction 166 receives the RF quadrature modulator output signal 214 and a loop phase adjustment output signal 203. The summing junction 166 generates the error signal 110 at the radio frequency $F_c$. The summing junction 166 transmits the error signal 110 to a loop dominant pole 216 of the forward path 104 of the control loop 103 of the system 100.

The loop dominant pole 216 receives the error signal 110. The loop dominant pole 216 provides nominal radio frequency feedback loop stability apart from any phase shift effects arising from supply modulation or drive level changes to the power amplifier 106. To provide nominal radio frequency feedback loop stability, the loop dominant pole 216 ensures that the phase margin of the system open-loop gain is at least 45° when the loop gain approaches unity. The loop dominant pole 216 generates a loop dominant pole output signal 218 and transmits the loop dominant pole output signal 218 to the phase modulator 130. The phase modulator 130 receives the loop dominant pole output signal 218 and the phase compensation mapping output signal 142. The phase modulator 130 generates the phase modulator output signal 178 and transmits the phase modulator output signal 178 to the power amplifier 106. The power amplifier 106 generates the power amplifier output signal 194 and transmits the power amplifier output signal 194 to the coupler 196. The coupler 196 transmits the major part 198 of the power amplifier output signal 194 to the antenna 102. The coupler 196 transmits the portion 200 of the power amplifier output signal 194 to a loop gain adjustment 220 of the control loop 103 of the system 100. The loop gain adjustment provides a level of open-loop gain corresponding to a desired nominal level of feedback linearization of distortion products.

The loop gain adjustment 220 generates the loop gain adjustment output signal 222 and transmits the loop gain adjustment output signal 222 to a loop phase adjustment 201. The loop phase adjustment 201 generates the loop phase adjustment output signal 203 that is fed back to the summing junction 166. The loop phase adjustment provides approximately 0° of open-loop gain phase at low relative frequencies as shown in FIG. 3.

Figure 9:
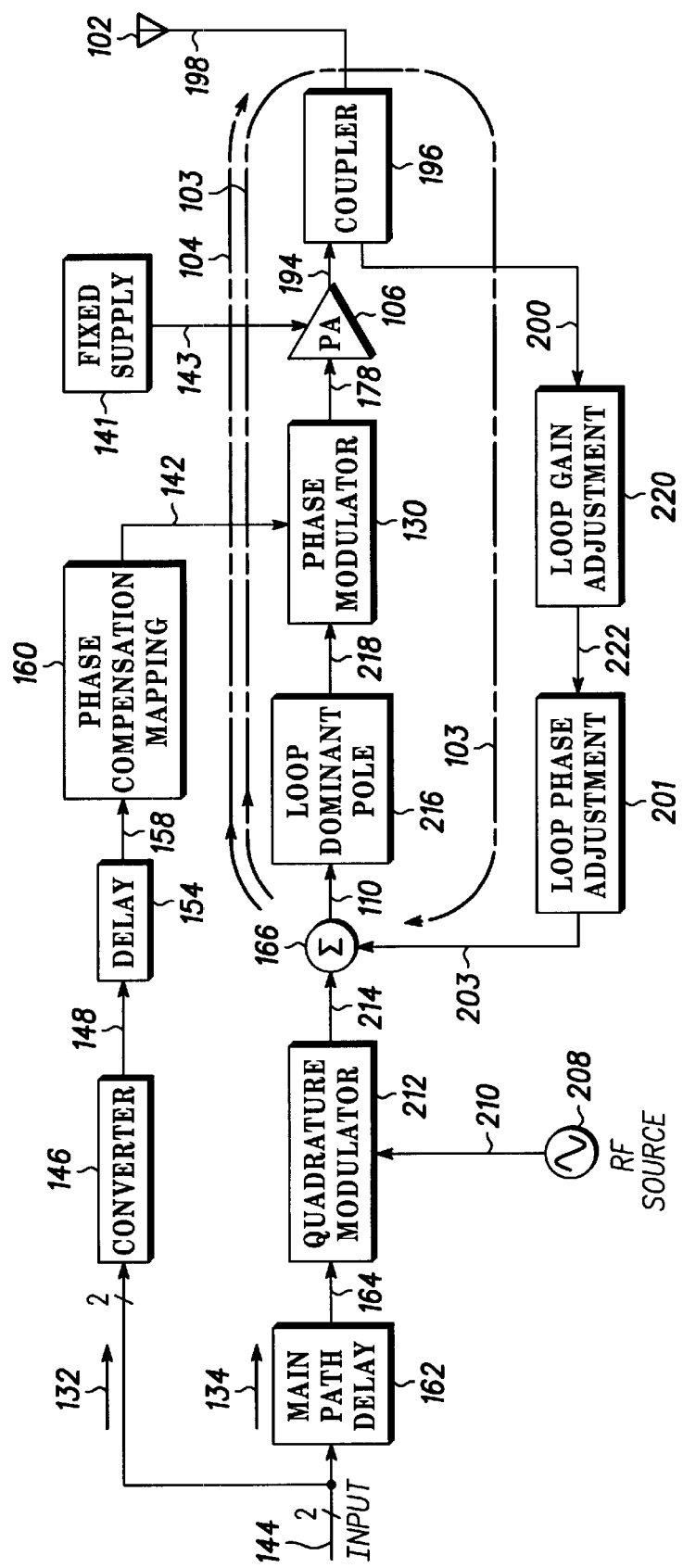
FIG. 9 is a block diagram of an alternate embodiment of a system with a radio frequency feedback loop but without a modulation mapping and without a supply modulator.

Referring now to FIG. 9, an alternate embodiment of the system 100 is shown implementing the radio frequency feedback without performing supply modulation.

Figure 10:
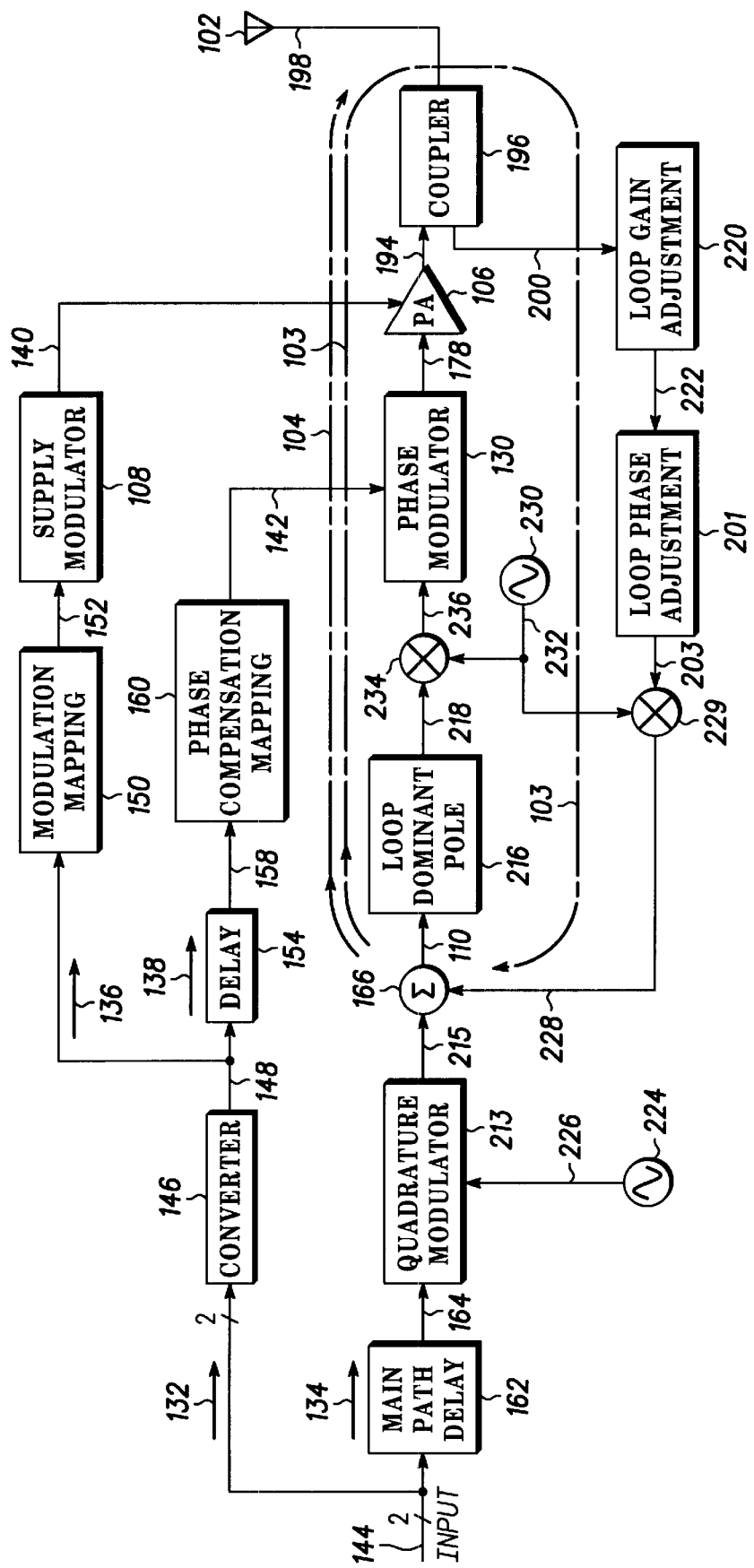
FIG. 10 is a block diagram of a system with an intermediate frequency feedback loop, a phase modulator, a phase compensation mapping, a modulation mapping, a supply modulator and a power amplifier.

Referring now to FIG. 10, an alternate embodiment of the system 100 is shown implementing intermediate frequency (IF) feedback. The system 100 has a local oscillator (LO) Source 224. The LO Source 224 operates at a frequency equal to the IF frequency $F_{if}$ employed within the system 100. The LO Source 224 has a LO Source output 226. An IF quadrature modulator 213 receives the LO Source output 226 and the main path delay output signal 164. The IF quadrature modulator 213 translates the main path delay output signal 164 up to the carrier frequency $F_{if}$. The IF quadrature modulator 213 generates the IF quadrature modulator output signal 215 and transmits the IF quadrature modulator output signal 215 to the summing junction 166.

The summing junction 166 receives the IF quadrature modulator output signal 214 and a feedback path downconverter output signal 228 of a feedback path downconverter 229. The summing junction 166 generates the error signal 110 and transmits the error signal 110 to the loop dominant pole 216.

The system 100 also has a second LO Source 230. The second LO Source 230 selectively operates at a frequency $F_c - F_{if}$ where $F_c$ is the operating carrier frequency of the system 100. The second LO source may selectively operate at a frequency $F_c + F_{if}$. The second LO Source 230 has a second LO Source output 232. A forward path upconverter 234 receives the second LO Source output 232 and the loop dominant pole output signal 218.

The forward path upconverter 234 generates a forward path upconverter output signal 236. The phase modulator 130 receives the forward path upconverter output signal 236 and the phase compensation mapping output signal 142. The phase modulator 130 generates the phase modulator output signal 178 and transmits the phase modulator output signal 178 to the power amplifier 106. The power amplifier 106 generates the power amplifier output signal 194 and transmits the power amplifier output signal 194 to the coupler 196. The coupler 196 transmits the major part 198 of the power amplifier output signal 194 to the antenna 102. The coupler 196 transmits the portion 200 of the power amplifier output signal 194 to the loop gain adjustment 220. The loop gain adjustment 220 transmits the loop gain adjustment output signal 222 to the loop phase adjustment 201. The loop phase adjustment 201 transmits the loop phase adjustment output signal 203 to a feedback path downconverter 229. The feedback path downconverter 229 receives the loop phase adjustment output signal 203 and the second LO Source output 232. The feedback path downconverter 229 generates the feedback path downconverter output signal 228.

Figure 11:
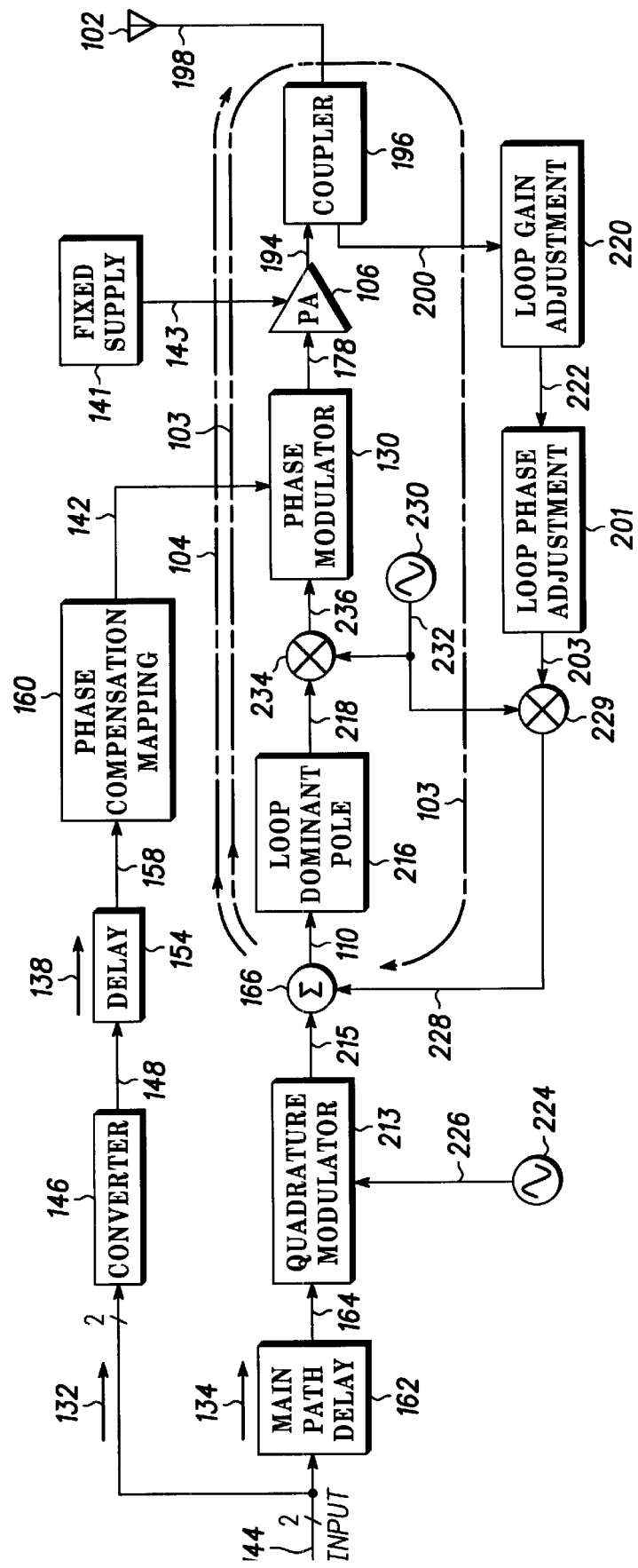
FIG. 11 is a block diagram of an alternate embodiment of a system with an intermediate frequency feedback loop but without a modulation mapping and without a supply modulator.

Referring now to FIG. 11, an alternate embodiment of the system 100 is shown implementing the intermediate frequency feedback without performing supply modulation.

Figure 12:
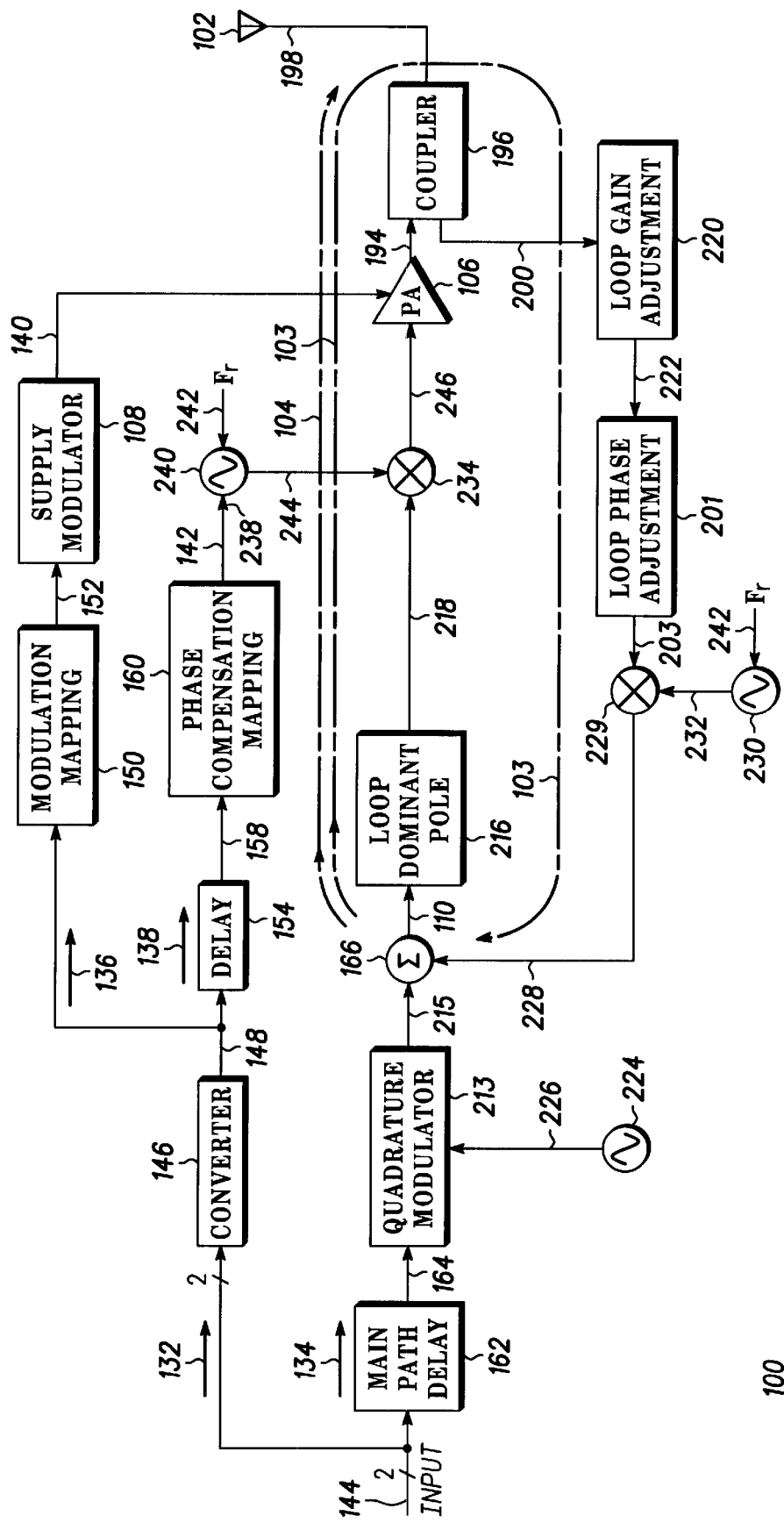
FIG. 12 is a block diagram of an alternate embodiment of a system with an alternate intermediate frequency feedback loop, a phase modulator, a phase compensation mapping, a modulation mapping, a supply modulator and a power amplifier.

Referring now to FIG. 12, an alternate embodiment of the system 100 is shown implementing a second form of intermediate frequency (IF) feedback. The phase compensation branch 138 of the modulation/compensation path 132 of the system 100 has a phase modulation port 238. The phase modulation port 238 permits phase modulation of a phase-modulated LO Source 240 contained within the system 100. The phase modulated LO Source 240 selectively has a frequency $F_c - F_{if}$. The phase modulated LO Source 240 may selectively have a frequency $F_c + F_{if}$. The phase modulated LO Source 240 receives a reference frequency 242 that is at a frequency $F_r$. The phase modulated LO Source 240 also receives the phase compensation mapping output signal 142 from the phase modulation port 238. The phase modulated LO Source 240 generates a phase modulated LO Source output 244.

The forward path upconverter 234 receives the phase modulated LO Source output 244 and the loop dominant pole output signal 218. The forward path upconverter 234 generates a forward path upconverter output signal 246 and transmits the forward path upconverter output signal 246 to the power amplifier 106. The power amplifier 106 generates the power amplifier output signal 194 and transmits the power amplifier output signal 194 to the coupler 196. The coupler 196 transmits the major part 198 of the power amplifier output signal 194 to the antenna 102. The coupler 196 transmits the portion 200 of the power amplifier output signal 194 to the loop gain adjustment 220. The loop gain adjustment 220 transmits the loop gain adjustment output signal 222 to the loop phase adjustment 201. The loop phase adjustment 201 transmits the loop phase adjustment output signal 203 to a feedback path downconverter 229. The feedback path downconverter 229 receives the loop phase adjustment output signal 203 and the second LO Source output 232. The second LO Source 232 receives a reference frequency 242 that is at a frequency $F_r$. The feedback path downconverter 229 generates the feedback path downconverter output signal 228.

Figure 13:
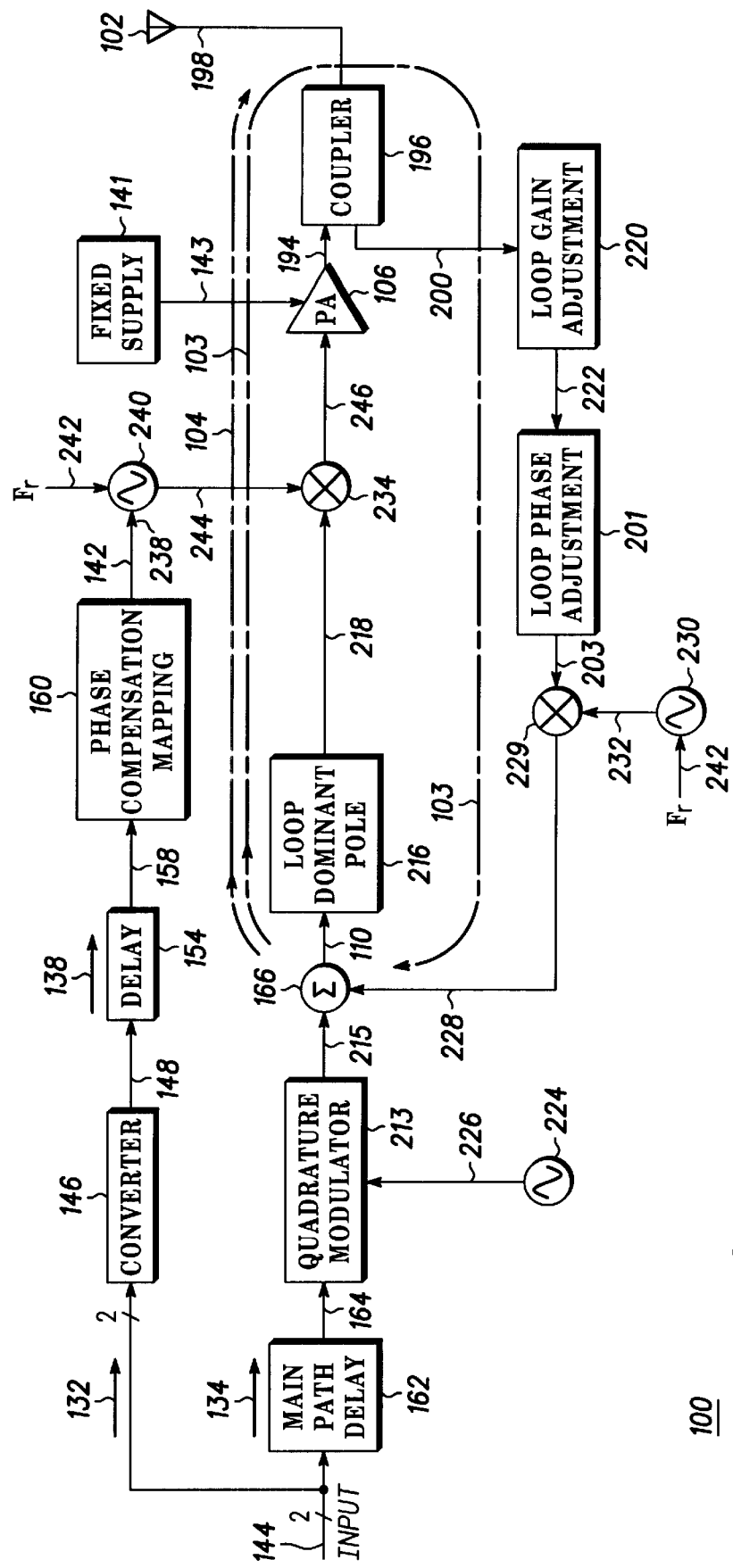
FIG. 13 is a block diagram of an alternate embodiment of a system with an alternate intermediate frequency feedback loop but without a modulation mapping and without a supply modulator.

Referring now to FIG. 13, an alternate embodiment of the system 100 is shown implementing the other intermediate frequency feedback system without supply modulation.

Figure 14:
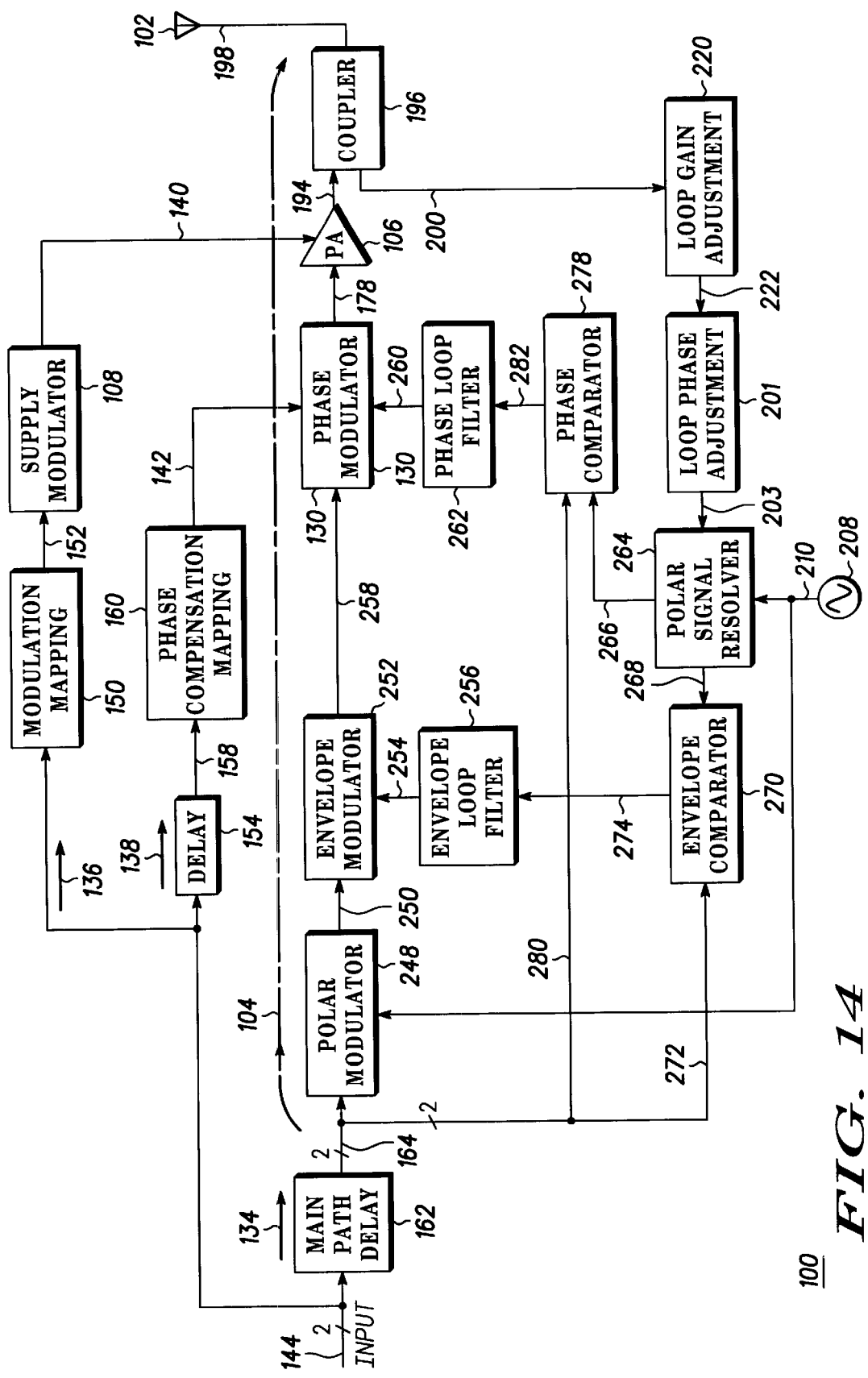
FIG. 14 is a block diagram of a system with a polar feedback loop, a phase modulator, a phase compensation mapping, a modulation mapping, a supply modulator and a power amplifier.

Referring now to FIG. 14, an alternate embodiment of the system 100 is shown implementing polar (envelope and phase) feedback. The input signal 144 is selectively a polar baseband input. The main path delay 162 receives the input signal 144 and transmits the main path delay output signal 164 to a polar modulator 248. The polar modulator 248 receives the main path delay output signal 164 and the RF source output 210 of the RF source 208. The RF source 208 is at the carrier frequency $F_c$ that corresponds to the operating frequency of the system 100. The polar modulator 248 translates a baseband envelope component and a baseband phase component to a signal at the operating carrier frequency $F_c$ of the system 100. The polar modulator 248 generates a polar modulator output signal 250 and transmits the polar modulator output signal 250 to an envelope modulator 252. The envelope modulator 252 receives the polar modulator output signal 250 and an envelope loop filter output signal 254 of an envelope loop filter 256. The envelope modulator 252 imposes additional envelope modulation on the polar modulator output signal 250 that is proportional to the envelope loop filter output signal 254. The envelope modulator 252 generates an envelope modulator output signal 258 and transmits the envelope modulator output signal 258 to the phase modulator 130.

The phase modulator 130 receives the envelope modulator output signal 258, the phase compensation mapping output signal 142 and a phase loop filter output signal 260 of a phase loop filter 262. The phase modulator 130 imposes additional phase modulation on the envelope modulator output signal 258 that is proportional to the sum of the phase compensation mapping output signal 142 and the phase loop filter output signal 260. The phase modulator 130 generates the phase modulator output signal 178 and transmits the phase modulator output signal 178 to the power amplifier 106.

The power amplifier 106 generates the power amplifier output signal 194 and transmits the power amplifier output signal 194 to the coupler 196. The coupler 196 transmits the major part 198 of the power amplifier output signal 194 to the antenna 102. The coupler 196 transmits the portion 200 of the power amplifier output signal 194 to the loop gain adjustment 220. The loop gain adjustment 220 transmits the loop gain adjustment output signal 222 to the loop phase adjustment 201. The loop phase adjustment 201 transmits the loop phase adjustment output signal 203 to a polar signal resolver 264. The polar signal resolver also receives the RF source output 210. The polar signal resolver 264 generates a polar signal resolver phase output signal 266 based on the phase component of the power amplifier output signal 194. The polar signal resolver 264 also generates a polar signal resolver envelope output signal 268 based on the envelope component of the power amplifier output signal 194.

The polar signal resolver 264 transmits the polar signal resolver envelope output signal 268 to an envelope comparator 270. The envelope comparator 270 receives the polar signal resolver envelope output signal 268 and a reference envelope 272 of the main path delay output signal 164. The envelope comparator 270 generates an envelope error signal 274 and transmits the envelope error signal 274 to the envelope loop filter 256.

The envelope loop filter 256 receives the envelope error signal 274. The envelope loop filter provides a dominant pole within the envelope portion of the polar feedback loop to establish stability and proper operation of the envelope portion of the polar feedback loop. The envelope loop filter 256 generates the envelope loop filter output signal 254 and transmits the envelope loop filter output signal 254 to the envelope modulator 252, thereby closing the envelope portion of the polar feedback loop.

The polar signal resolver 264 transmits the polar signal resolver phase output signal 266 to a phase comparator 278.

The phase comparator 278 receives the polar signal resolver phase output signal 266 and a reference phase 280 of the main path delay output signal 164. The phase comparator 278 generates a phase error signal 282 and transmits the phase error signal 282 to the phase loop filter 262.

The phase loop filter 262 receives the phase error signal 282. The phase loop filter provides a dominant pole within the phase portion of the polar feedback loop to establish stability and proper operation of the phase portion of the polar feedback loop. The phase loop filter 262 generates the phase loop output signal 260 and transmits the phase loop output signal 260 to the phase modulator 130, thereby closing the phase portion of the polar feedback loop.

Figure 15:
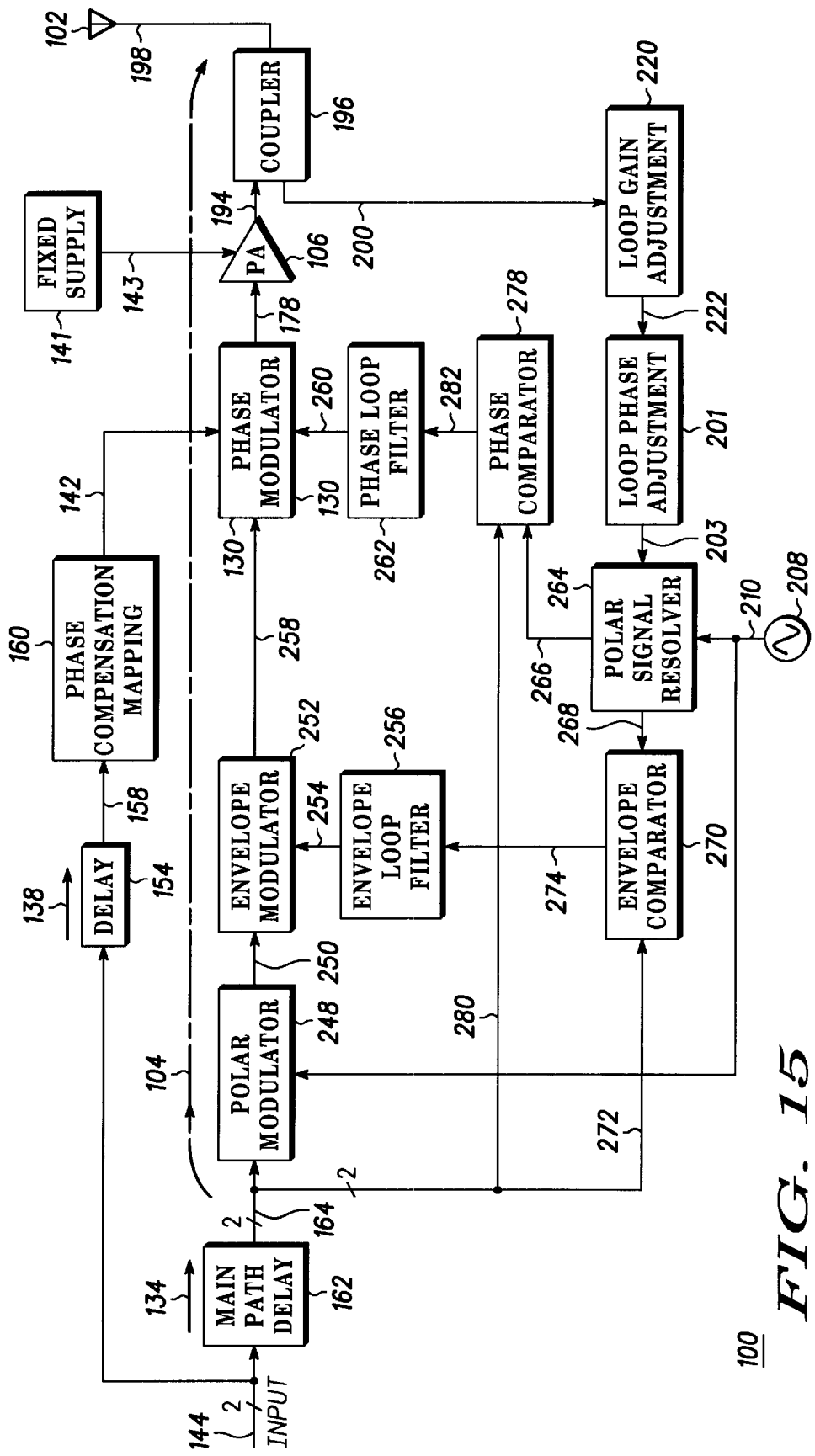
FIG. 15 is a block diagram of an alternate embodiment of a system with a polar feedback loop but without a modulation mapping and without a supply modulator.

Referring now to FIG. 15, an alternate embodiment of the system 100 is shown implementing the polar feedback without supply modulation.

While a detailed description of exemplary embodiments of the invention have been given, it should be appreciated that many variations can be made thereto without departing from the scope of the invention as set forth in the appended claims.

What is claimed is:

1. A method, comprising the steps of:

generating an error signal based at least in part on an input signal for a system that is coupled with a power amplifier, wherein the error signal includes a phase component, wherein the input signal includes an envelope component; and modifying the phase component of a signal based on the error signal in response to the envelope component of the input signal to reduce variation of a phase component of an output signal from the power amplifier.

2. The method of claim 1, wherein the step of generating the error signal based at least in part on the input signal for the system that is coupled with the power amplifier comprises the step of generating the error signal through employment of a comparison of a signal based on the input signal with a feedback signal that is based on a portion of the output signal from the power amplifier.

3. The method of claim 1, wherein the step of modifying the phase component of the error signal in response to the envelope component of the input signal to reduce variation of the phase component of the output signal from the power amplifier comprises the step of modifying the phase component of a signal based on the error signal to approximately compensate for a predicted modification by the power amplifier of the phase component of the output signal.

4. The method of claim 1, wherein the step of modifying the phase component of a signal based on the error signal in response to the envelope component of the input signal to reduce variation of the phase component of the output signal from the power amplifier comprises the step of inputting a signal based on the error signal with a modified phase component to the power amplifier.

5. The method of claim 1, wherein the step of modifying the phase component of a signal based on the error signal in response to the envelope component of the input signal to reduce variation of the phase component of the output signal from the power amplifier comprises the step of promoting approximate maintenance of a predetermined phase margin of a feedback signal while the feedback signal is compared to a signal based on the input signal as the envelope component of the input signal varies.

6. A method, comprising the steps of:

generating an error signal based at least in part on an input signal for a system that is coupled with a power amplifier, wherein a signal based on the error signal includes a modified phase component, wherein the input signal includes an envelope component, wherein the power amplifier outputs an output signal that is based on the error signal having the modified phase component; and promoting approximate maintenance of a predetermined phase margin of a feedback signal when the feedback signal is compared to a signal based on the input signal by modifying the phase component of a signal based on the error signal in response to the envelope component of the input signal to approximately compensate for a predicted modification by the power amplifier of a phase component of the output signal.

7. The method of claim 6, wherein the step of promoting approximate maintenance of the predetermined phase margin of the feedback signal when the feedback signal is compared to a signal based on the input signal by modifying the phase component of the error signal in response to the envelope component of the input signal to approximately compensate for the predicted modification by the power amplifier of the phase component of the output signal comprises the step of reducing variation of the phase component of the output signal as the envelope component of the input signal traverses a dynamic range.

8. The method of claim 6, wherein the predicted modification by the power amplifier of the phase component of the output signal comprises a particular variation of the phase component of the output signal promoted by the power amplifier, and wherein the step of promoting approximate maintenance of the predetermined phase margin of the feedback signal when the feedback signal is compared to a signal based on the input signal by modifying the phase component of a signal based on the error signal in response to the envelope component of the input signal to approximately compensate for the predicted modification by the power amplifier of the phase component of the output signal comprises the step of reducing and/or approximately eliminating the particular variation of the phase component of the output signal promoted by the power amplifier.

9. The method of claim 8, wherein the step of reducing and/or approximately eliminating the particular variation of the phase component of the output signal promoted by the power amplifier comprises the step of adding a phase shift to a signal based on the error signal approximately equal to in magnitude and opposite in direction relative to a direction of the particular variation of the phase component of the output signal promoted by the power amplifier.

10. The system of claim 6, wherein the generation component that generates the error signal based at least in part on the input signal for the system comprises a generation component that compares the input signal to a feedback signal that is based on a portion of the output signal from the power amplifier.

11. The system of claim 6, wherein the modification component that modifies the phase component of the error signal in response to the envelope component of the input signal to reduce variation of a phase component of an output signal from the power amplifier comprises a modification component that modifies the phase component of the error signal to approximately compensate for a predicted modification by the power amplifier of the phase component of the output signal.

12. The method of claim 6, wherein the step of generating the error signal based at least in part on the input signal for the system that is coupled with the power amplifier comprises the step of employing one or more of Cartesian feedback, radio frequency feedback, intermediate frequency feedback and polar feedback to generate the error signal.

13. A system that is coupled with a power amplifier, comprising:
    a generation component that generates an error signal based at least in part on an input signal for the system, wherein the error signal includes a phase component wherein the input signal includes an envelope component; and
    a modification component that modifies the phase component of a signal based on the error signal in response to the envelope component of the input signal to reduce variation of a phase component of an output signal from the power amplifier.

14. The system of claim 13, wherein the modification component that modifies the phase component of a signal based on the error signal in response to the envelope component of the input signal to reduce variation of a phase component of an output signal from the power amplifier comprises a modification component that transmits a signal based on the error signal with a modified phase component to the power amplifier.

15. The system of claim 13, wherein the generation component that generates the error signal based at least in part on the input signal for the system comprises a generation component that promotes an approximate maintenance of a predetermined phase margin of a feedback signal while the feedback signal is compared to a signal based on the input signal as the envelope component of the input signal varies.

16. A system that is coupled with a power amplifier, comprising:
    a generation component that generates an error signal based at least in part on an input signal for the system, wherein a signal based on the error signal includes a modified phase component, wherein the input signal includes an envelope component, wherein the power amplifier outputs an output signal that is based on a signal based on the error signal having the modified phase component; and
    a modification component that promotes an approximate maintenance of a predetermined phase margin of a feedback signal when the feedback signal is compared to a signal based on the input signal by modifying the phase component of a signal based on the error signal in response to the envelope component of the input signal to approximately compensate for a predicted modification by the power amplifier of a phase component of the output signal.

17. The system of claim 16, wherein the modification component that approximately compensates for the predicted modification by the power amplifier of a phase component of the output signal comprises a modification component that reduces variation of the phase component of the output signal as the envelope component of the input signal traverses a dynamic range.

18. The system of claim 16, wherein the predicted modification by the power amplifier of the phase component of the output signal comprises a particular variation of the phase component promoted by the power amplifier, and wherein the modification component that approximately compensates for a predicted modification by the power amplifier of a phase component of the output signal comprises a modification component that reduces and/or approximately eliminates the particular variation of the phase component of the output signal promoted by the power amplifier.

19. The system of claim 18, further comprising a supply modulator that modulates a supply voltage for the power amplifier to promote an increase in operating power efficiency of the power amplifier by transmitting an envelope modulated signal to the power amplifier.

20. The system of claim 18, wherein the generation component that generates the error signal based at least in part on the input signal for the system comprises a generation component that employs one or more of Cartesian feedback, radio frequency feedback, intermediate frequency feedback and polar feedback to generate the error signal.

21. The system of claim 16, wherein the modification component that reduces and/or approximately eliminates the particular variation of the phase component of the output signal promoted by the power amplifier comprises a modification component that adds a phase shift to the error signal approximately equal to in magnitude and opposite in direction relative to a direction of the particular variation of the phase component of the output signal promoted by the power amplifier.

22. The system of claim 18, further comprises a supply voltage that generates a particular modification in the phase component of the output signal of the power amplifier.

* * * * *